(12) United States Patent
Perrin

(10) Patent No.: US 9,876,076 B2
(45) Date of Patent: Jan. 23, 2018

(54) METHOD FOR LOCAL ISOLATION BETWEEN TRANSISTORS PRODUCED ON AN SOI SUBSTRATE, IN PARTICULAR AN FDSOI SUBSTRATE, AND CORRESPONDING INTEGRATED CIRCUIT

(71) Applicant: STMICROELECTRONICS (CROLLES 2) SAS, Crolles (FR)

(72) Inventor: Emmanuel Perrin, Bernin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/956,594

(22) Filed: Dec. 2, 2015

(65) Prior Publication Data

US 2016/0351660 A1    Dec. 1, 2016

(30) Foreign Application Priority Data

May 29, 2015    (FR) ..................................... 15 54853

(51) Int. Cl.
| | | |
|---|---|---|
| *H01L 29/06* | (2006.01) | |
| *H01L 29/66* | (2006.01) | |
| *H01L 21/84* | (2006.01) | |
| *H01L 27/12* | (2006.01) | |
| *H01L 21/8238* | (2006.01) | |
| *H01L 21/762* | (2006.01) | |

(52) U.S. Cl.
CPC .... *H01L 29/0649* (2013.01); *H01L 21/76283* (2013.01); *H01L 21/823878* (2013.01); *H01L 21/84* (2013.01); *H01L 27/1203* (2013.01); *H01L 29/66545* (2013.01)

(58) Field of Classification Search
None
See application file for complete search history.

(56) References Cited

U.S. PATENT DOCUMENTS

| | | |
|---|---|---|
| 6,303,962 B1 | 10/2001 | Gardner et al. |
| 6,455,894 B1* | 9/2002 | Matsumoto ............. H01L 21/84 257/347 |
| 6,713,335 B2 | 3/2004 | Yen et al. |
| 2009/0174458 A1 | 7/2009 | Campbell et al. |
| 2010/0052065 A1 | 3/2010 | Diaz et al. |
| 2010/0258869 A1 | 10/2010 | Morita et al. |
| 2011/0193167 A1 | 8/2011 | Fung et al. |
| 2011/0287600 A1 | 11/2011 | Cheng et al. |
| 2012/0153393 A1* | 6/2012 | Liang .................. H01L 21/8213 257/347 |
| 2013/0043535 A1 | 2/2013 | Anderson et al. |
| 2013/0093020 A1 | 4/2013 | Zhu et al. |
| 2013/0140639 A1 | 6/2013 | Shieh et al. |

FOREIGN PATENT DOCUMENTS

| | | |
|---|---|---|
| DE | 102012101875 | 6/2013 |
| EP | 1391925 | 2/2004 |

* cited by examiner

*Primary Examiner* — Whitney T Moore
(74) *Attorney, Agent, or Firm* — Seed IP Law Group LLP

(57) ABSTRACT

An integrated circuit may include an SOI substrate having a buried insulating layer, and a semiconductor film above the buried insulating layer. The semiconductor film may have first patterns in a first zone defining gate regions of first MOS transistors and also first dummy gate regions. The first zone may include two domains having a space therebetween, and the space may be filled by at least one insulating material and be situated between two dummy gate regions above a region of the supporting substrate without any insulating trench.

21 Claims, 3 Drawing Sheets

METHOD FOR LOCAL ISOLATION BETWEEN TRANSISTORS PRODUCED ON AN SOI SUBSTRATE, IN PARTICULAR AN FDSOI SUBSTRATE, AND CORRESPONDING INTEGRATED CIRCUIT

TECHNICAL FIELD

The implementations and embodiments set forth herein relate to integrated circuits, and more particularly the electrical insulation between transistors, for example of the same conductivity type, produced on a silicon on insulator SI substrate, and in particular a fully depleted SOI (FDSOI) substrate.

BACKGROUND

An SOI substrate generally includes a semiconductor film, for example of silicon or a silicon alloy, of uniform thickness, resting on a buried insulating layer, commonly referred to by the acronym "BOX" (Buried-OXide), which is itself situated above a supporting semiconductor substrate. In FDSOI technology, the semiconductor film is generally very thin (e.g., a few nanometres thick) and is fully depleted, which helps ensure desired electrostatic control.

Currently, to produce the insulation between these transistors, the production of the transistors is preceded by the formation of a shallow trench in the substrate, commonly referred to by the acronym "STI" (Shallow Trench Isolation), and more particularly in the semiconductor film. This creates separate domains in the semiconductor film that are electrically insulated from one another for the transistors, which are typically of a same conductivity type. However, since the space between the active zones (corresponding to the domains of the semiconductor films), in particular for insulating transistors of the same conductivity type, is becoming increasingly small due to technological refinements, the production of these trenches by photolithography is becoming more complicated.

SUMMARY

According to one implementation, it is proposed to produce such insulation in a different manner which is compatible with existing CMOS fabrication methods.

According to one aspect, a method is provided that includes forming electrical insulation between two domains of a first zone of a semiconductor film situated above a buried insulating layer, itself situated above a supporting substrate. The two domains may support respective first MOS transistors, e.g., of a same P or N conductivity type.

According to one embodiment, production of the insulation may be performed after the formation of the gate regions of the first transistors. This may include forming, above the first zone of the semiconductor film, first patterns gate regions and first dummy gate regions, and performing a localized etching of a first part of the semiconductor film between two first dummy gate regions down to the buried insulating layer. Further, the first etched part of the semiconductor film may be filled by at least one insulating material (e.g., a dielectric such as PMD ("PreMetal Dielectric")) to thereby form the two domains of the semiconductor film electrically insulated from one another.

In other words, according to this aspect, there is a distinction from prior approaches in that the production of shallow trenches with the attendant photolithographic constraints is dispensed with, and the insulation is produced after the production of the gates by a simple etching step.

According to one implementation, formation of the source and drain regions of the first transistors may include covering the first patterns and the first zone of the semiconductor film with at least one insulating layer, and removing the at least one insulating layer between the first patterns except for the part of the at least one insulating layer covering the first part of the semiconductor film, which may be etched subsequently. A first epitaxy of a first semiconductor material may be formed on the first zone of the semiconductor film between the first patterns, except for the first part of the semiconductor film covered by the at least one insulating layer. The localized etching may include etching the at least one insulating layer, the first part of the semiconductor film, and a partial etching of the epitaxial regions.

During removal of the at least one insulating layer between the first patterns, the part of the at least one insulating layer covering the first part of the semiconductor film may be protected by a block of resin overlapping the two first patterns bracketing this first part. Production by photolithography of this overlapping block of resin may therefore be less constraining than a photolithography step used in prior approaches to produce the shallow trenches.

The method may further include producing second transistors of a second conductivity type in and on a second zone of the semiconductor film electrically insulated from the first zone.

According to one implementation, production of the second transistors may include forming, above the second zone of the semiconductor film, second patterns gate regions of the second transistors and second dummy gate regions. Formation of the source and drain regions of the second transistors may include a second epitaxy of a second semiconductor material on the second zone of semiconductor film between the second patterns. Each portion of semiconductor film situated between the two first patterns may be protected by a first insulating layer during the second epitaxy. Each second epitaxial region may be protected by a second insulating layer during the first epitaxy, with the first part of the semiconductor film (that which will be etched subsequently) being protected by the two insulating layers.

The semiconductor film may be, for example, a film of silicon or of a fully depleted silicon alloy.

According to another aspect, an integrated circuit is proposed that may include an SOI substrate including a semiconductor film situated above a buried insulating layer, itself situated above a supporting substrate. The semiconductor film may include a first zone, first patterns above the first zone of the semiconductor film forming the gate regions of first MOS transistors and first dummy gate regions. The first zone of the semiconductor film may include two domains spaced apart from one another. The space may be filled by at least one insulating material and situated between two dummy gate regions and above a region of the supporting substrate without any insulating trench.

According to one embodiment, the integrated circuit may include at least one first metallization level separated from the semiconductor film by an insulating region of which a part is situated in the space.

In one embodiment, the first transistors are transistors of a same first conductivity type. The semiconductor film may include a second zone electrically insulated from the first zone and supporting second transistors of a second conductivity type.

Advantageously, the semiconductor film may be a film of silicon or of a fully depleted silicon alloy.

BRIEF DESCRIPTION OF THE DRAWINGS

Other advantages and features will become apparent upon studying the detailed description of non-limiting implementations and embodiments, and the attached drawings, in which.

DETAILED DESCRIPTION

Figure 1:
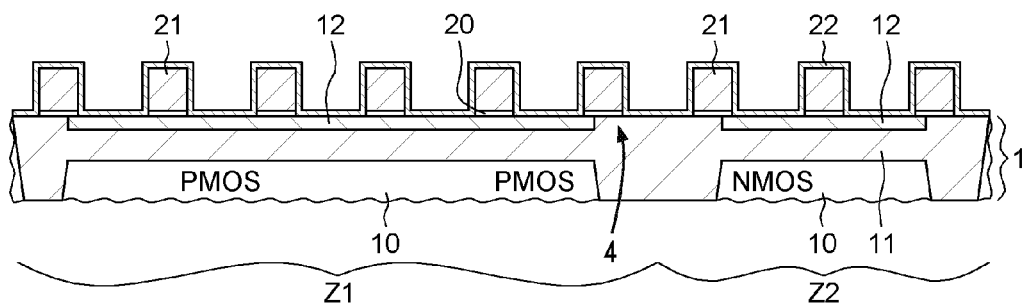
FIGS. 1 to 8 are schematic cross-sectional diagrams illustrating implementations and embodiments for forming insulating regions in semiconductor devices.

FIG. 1 partially illustrates a semiconductor wafer including an FDSOI substrate 1 with a supporting substrate 10, a buried insulating layer 11 and a semiconductor film 12. The semiconductor film 12 may comprise silicon or a silicon alloy for example. Insulating trenches 4 are conventionally produced which divide the semiconductor film into two zones Z1 and Z2.

In the first zone Z1, the aim is to produce transistors of a first conductivity type, for example, PMOS transistors. In the second zone Z2, the aim is to produce transistors of a second conductivity type, for example, NMOS transistors. Moreover, there is also a desire to produce in the zone Z1, for example, a local insulation between two groups of PMOS transistors.

After having formed an oxide layer 20 on the semiconductor film, a layer of gate material 21 is deposited as a solid wafer that is etched conventionally to obtain a set of evenly spaced patterns 21. Some of these patterns will form insulated gate regions of the transistors, others will form dummy gate regions. The even spacing between the patterns facilitates the photolithographic etching of the layer of gate material.

Figure 2:
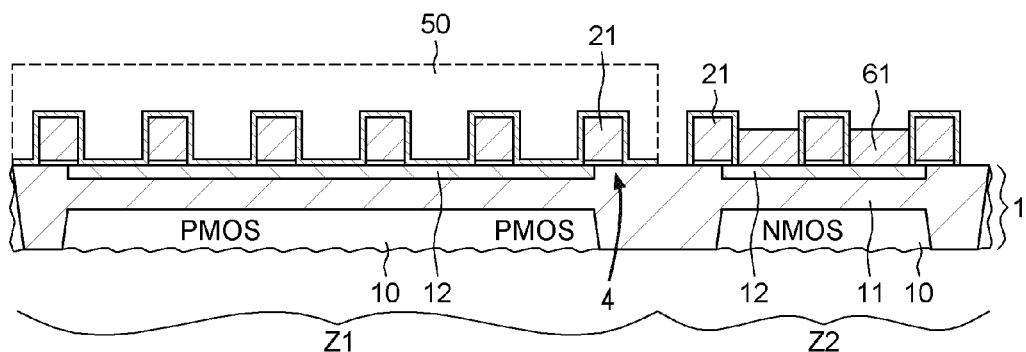

Following production of the patterns, an insulating layer 22 is deposited as a solid wafer, e.g., of silicon nitride (SiN), to cover the patterns 21 and the portions of semiconductor film 12 situated between the patterns. Then, as illustrated in FIG. 2, the first zone Z1 is covered with a resin mask 50 which will protect the insulating layer 22 situated in the zone Z1 during the next step of anisotropic etching. The anisotropic etching of the insulating layer is then performed according to a conventional method of the nitride layer 22 to strip the semiconductor film 12 between the patterns of the second zone Z2.

After having removed the resin mask 50, a first epitaxy of a material of N type is carried out on the regions of the second zone Z2 situated between the gate regions 21 to produce the raised source and drain regions 61 of the NMOS transistors. It will be noted here that the first insulating layer 22 makes it possible to prevent epitaxial material from forming between the patterns of the zone Z1.

Figure 3:
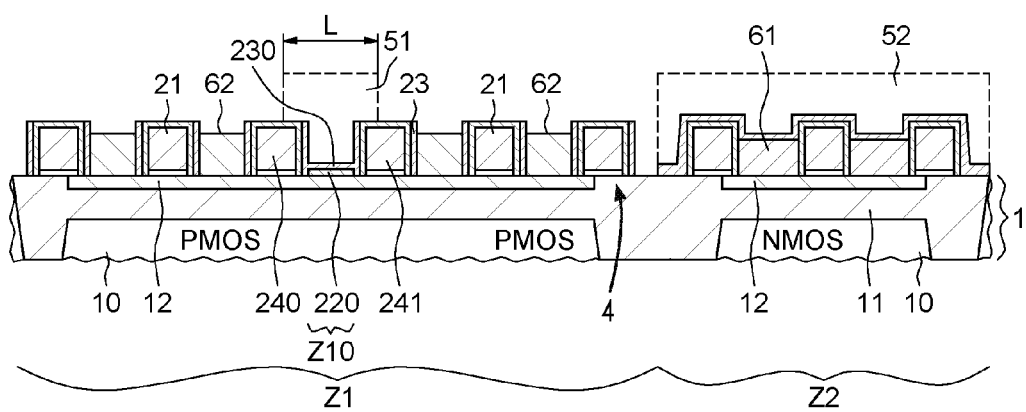

Then, as illustrated in FIG. 3, a second insulating layer 23 (e.g., silicon nitride (SiN)) is deposited over all of the wafer. The production of the local insulation between the PMOS transistors will be carried out in the subzone Z10 between the two dummy gate regions 240 and 241.

To this end, a conventional photolithography step may be used to produce a block of resin 51 in the subzone Z10. This will protect the portions 220 and 230 of the insulating layers situated above the semiconductor film 12.

Moreover, this block of resin overlaps the dummy gate zones 240 and 241. The production of this block of width L, for example of the order of 40 nanometers, is less constraining from the photolithographic point of view than the production of an insulating trench in the subzone Z10, because the width L is greater than the width of such a trench.

In addition to this block of resin, a second block of resin 52 is produced, also by photolithography, in the zone Z2. The first and the second insulating layers 22 and 23 are then etched in a conventional and anisotropic manner to strip the semiconductor film in the zones not protected by the blocks of resin 51 and 52.

The blocks of resin 51 and 52 are then removed, and then a second conventional epitaxy of P type is carried out on the regions of the first zone Z1 situated between the patterns 21 to form the raised source and drain regions 62 of the PMOS transistors. However, since the subzone Z10 of the semiconductor film is protected by the portions 220 and 230 of the insulating layers, there will be no epitaxy in that subzone.

Figure 4:
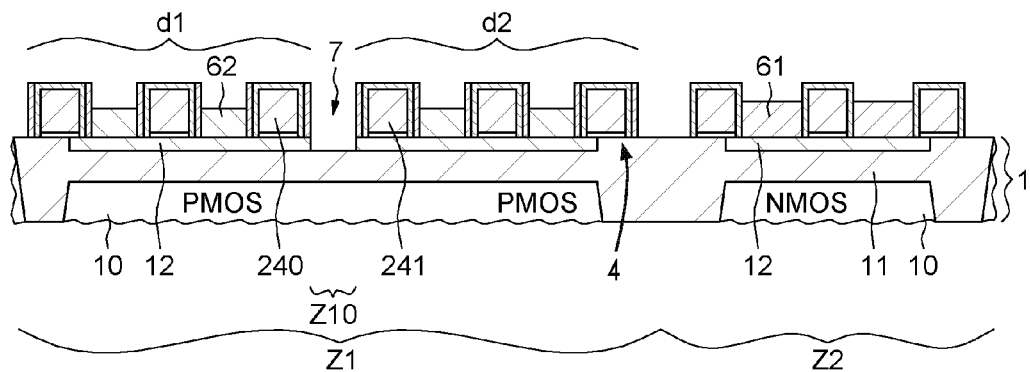

A full wafer anisotropic etching is then carried out as illustrated in FIG. 4, according to a conventional method, to etch the portions 220 and 230 of the insulating layers 22 and 23 and then the semiconductor film 12 down to the buried insulating layer 11. During this etching, a portion of the epitaxial zones 61 and 62 is consumed.

Thus, the first zone Z1 is divided into two domains d1 and d2. The space 7 between these two domains d1 and d2 will be filled by at least one insulating material, as will be discussed below.

Figure 5:
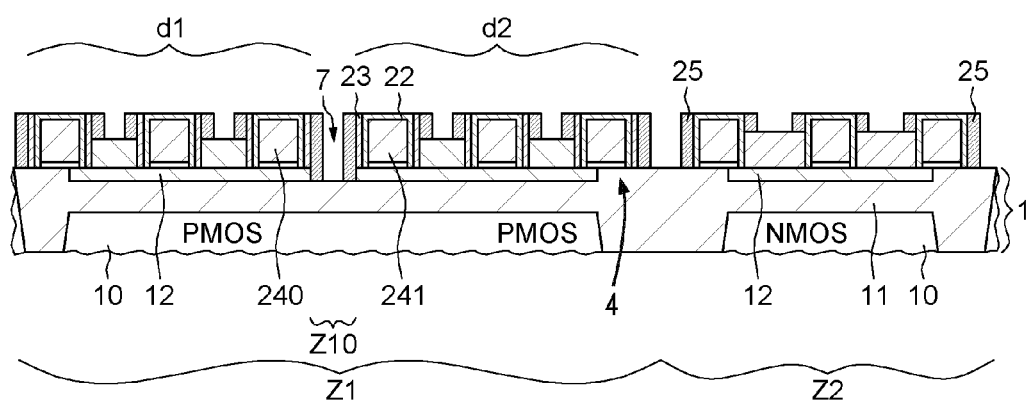

As illustrated in FIG. 5, a protective layer 25, e.g., a layer of silicon oxide is deposited or formed over the entire wafer. The layer is then etched according to a conventional anisotropic method so that only the vertical regions 25 of the layer of silicon oxide remain. The purpose of the vertical regions is to protect the spacers 22 and 23 of silicon nitride from the gate regions 21 during the next etching step.

Figure 6:
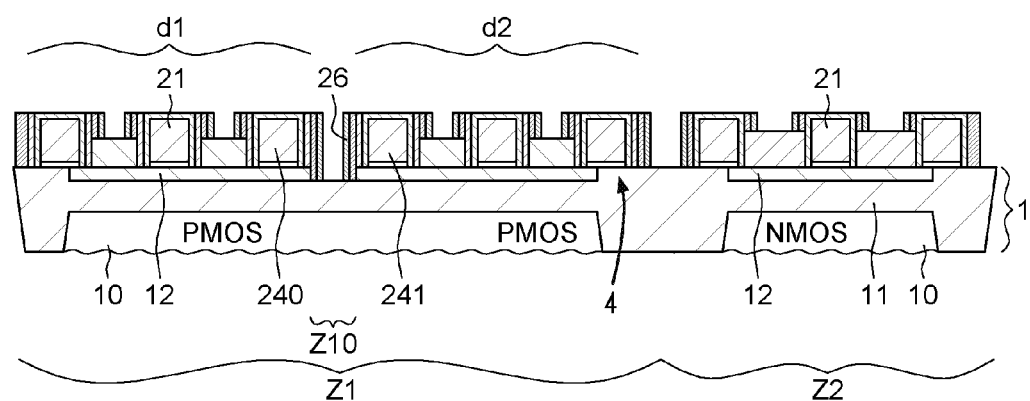

A full wafer deposition may then be performed of a protective layer 26 (FIG. 6), e.g., silicon nitride (SiN), known to those skilled in the art by the term SIPROT. This protects the elements of the integrated circuit that do not have to be siliconized (these elements are not represented in the diagrams for the purposes of simplicity). After masking, an anisotropic etching of the protective layer 26 is then carried out according to a conventional method in the region where silicidation is to take place.

Figure 7:
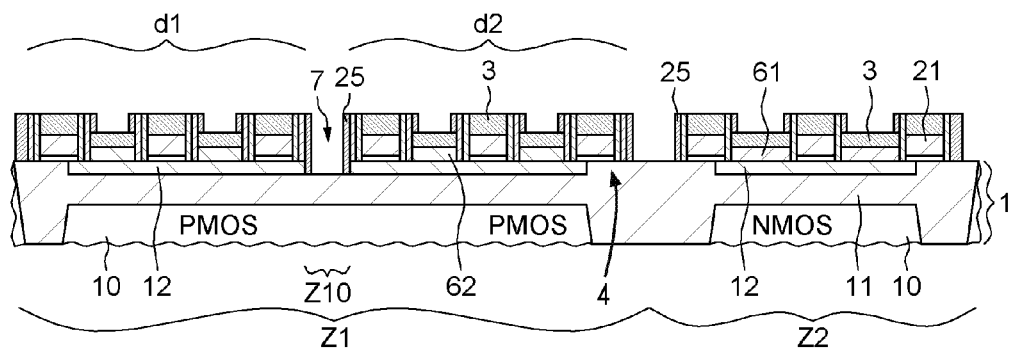
Figure 8:
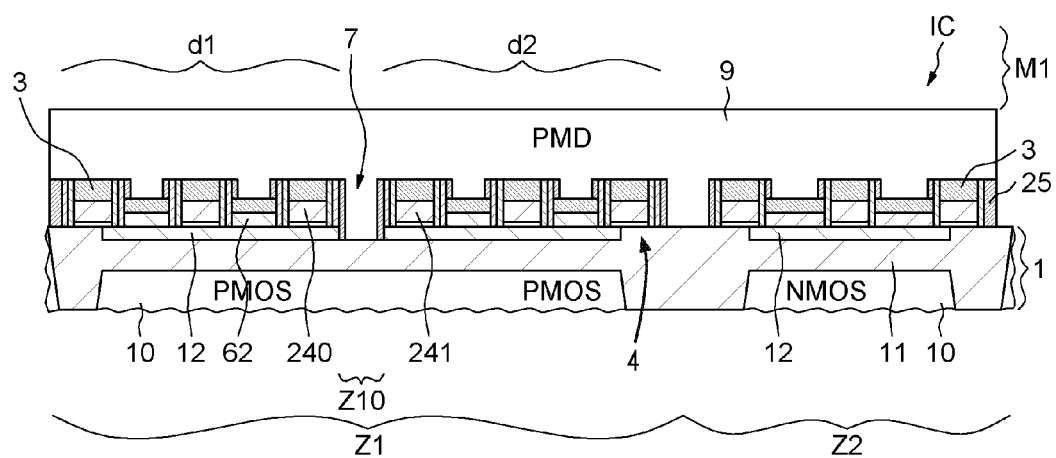

Next, as illustrated in FIG. 7, a conventional silicidation is performed to form metal silicide 3 on the epitaxial regions 61 and 62, and on the top of the patterns 21. Then, as illustrated in FIG. 8, there is a full wafer deposition of a layer of insulating material 9 of PMD (PreMetal Dielectric) to insulate the components from the first metallisation level M1 of the integrated circuit.

Electrical contacts, e.g., tungsten, may be produced in a conventional manner in the insulating region 9 prior to the production of the tracks of the metal level M1 to link the active zones (sources and/or drain and/or gate) to these tracks. In particular, the insulating material 9 fills the space 7 situated between the two domains d1 and d2 of the zone Z1. The electrical insulation is thus completed between the domains d1 and d2 including PMOS transistors.

An integrated circuit IC is thereby obtained that includes an SOI substrate 1, including a semiconductor film 12 situated above a buried insulating layer 11, itself situated on a supporting substrate 10. The semiconductor film is divided into two zones, namely a zone Z1 which includes PMOS transistors and a zone Z2 which includes NMOS transistors. The first zone Z1 is divided into two subzones d1 and d2. A space 7 between the two domains is filled by at least one insulating material forming a part of the PMD insulating layer 9. Moreover, the space 7 is situated between the dummy gate regions 240 and 241 above a region of the supporting substrate without any insulating trench.

That which is claimed is:

1. A method for making a semiconductor device comprising:
    forming, in a semiconductor film above a buried insulating layer on a substrate, a first pattern of gate regions and dummy gate regions;
    after forming the dummy gate regions, locally etching through a first portion of the semiconductor film, between two of the dummy gate regions, completely down to the buried insulating layer;
    forming at least one insulating material between the two dummy gate regions to define first and second domains of the semiconductor film that are electrically insulated from one another; and
    forming at least one MOS transistor in each of the first and second domains using the gate regions.

2. The method of claim 1 wherein forming the MOS transistors further comprises forming source and drain regions of the MOS transistors by:
    forming at least one insulating layer on the first pattern of gate regions and the dummy gate regions;
    removing the at least one insulating layer between the gate regions and dummy gate regions except in the first portion between the two dummy gates; and
    epitaxially forming a first semiconductor material on the semiconductor film between the gate regions and the dummy gate regions except in the first portion between the two dummy gates;
    wherein locally etching comprises locally etching the at least one insulating layer.

3. The method of claim 2 wherein locally etching further comprises partially etching the epitaxial material between the gate regions and the dummy gate regions.

4. The method of claim 2 further comprising, prior to removing the at least one insulating layer between the two dummy gates, forming a block of resin over the portion of the at least one insulating layer covering the first portion of the semiconductor film between the two dummy gates.

5. The method of claim 1 wherein the at least one MOS transistor in each of the first and second domains are of a same conductivity type.

6. The method of claim 5 wherein the first and second domains are in a first zone of the semiconductor film; and further comprising forming MOS transistors of a different conductivity type in second zone of the semiconductor film electrically insulated from the first zone.

7. The method of claim 6 wherein forming the MOS transistors of the different conductivity types comprises:
    forming above the second zone of the semiconductor film a second pattern of gate regions and dummy gate regions; and
    forming source and drain regions of the transistors of the different conductivity type by epitaxially forming a second semiconductor material on the second zone of the semiconductor film between the gate regions and the dummy gate regions thereof.

8. The method of claim 1 wherein the semiconductor film comprises at least one of silicon or a fully depleted silicon alloy.

9. The method of claim 1, wherein:
    locally etching forms an opening extending completely through the semiconductor film and between the two dummy gate regions; and
    forming the at least one insulating material between the two dummy gate regions includes completely filling the opening with the at least one insulating material, which contacts the buried insulating layer.

10. A method for making a semiconductor device comprising:
    forming, in a semiconductor film above a buried insulating layer on a substrate, a first pattern of gate regions and dummy gate regions, the semiconductor film comprising at least one of silicon or a fully depleted silicon alloy;
    after forming the dummy gate regions, locally etching through a first portion of the semiconductor film, between two of the dummy gate regions, completely down to the buried insulating layer;
    forming at least one insulating material between the two dummy gate regions to define first and second domains of the semiconductor film that are electrically insulated from one another; and
    forming at least one MOS transistor in each of the first and second domains using the gate regions and having a same conductivity type.

11. The method of claim 10 wherein forming the MOS transistors further comprises forming source and drain regions of the MOS transistors by:
    forming at least one insulating layer on the first pattern of gate regions and the dummy gate regions;
    removing the at least one insulating layer between the gate regions and dummy gate regions except in the first portion between the two dummy gates; and
    epitaxially forming a first semiconductor material on the semiconductor film between the gate regions and the dummy gate regions except in the first portion between the two dummy gates;
    wherein locally etching comprises locally etching the at least one insulating layer.

12. The method of claim 11 wherein locally etching further comprises partially etching the epitaxial material between the gate regions and the dummy gate regions.

13. The method of claim 11 further comprising, prior to removing the at least one insulating layer between the two dummy gates, forming a block of resin over the portion of the at least one insulating layer covering the first portion of the semiconductor film between the two dummy gates.

14. The method of claim 10 wherein the first and second domains are in a first zone of the semiconductor film; and further comprising forming MOS transistors of a different conductivity type in second zone of the semiconductor film electrically insulated from the first zone.

15. The method of claim 14 wherein forming the MOS transistors of the different conductivity types comprises:
    forming above the second zone of the semiconductor film a second pattern of gate regions and dummy gate regions; and
    forming source and drain regions of the transistors of the different conductivity type by epitaxially forming a second semiconductor material on the second zone of the semiconductor film between the gate regions and the dummy gate regions thereof.

16. The method of claim 10, wherein:
    locally etching forms an opening extending completely through the semiconductor film and between the two dummy gate regions; and
    forming the at least one insulating material between the two dummy gate regions includes completely filling the opening with the at least one insulating material, which contacts the buried insulating layer.

17. A method for making a semiconductor device comprising:
    forming, in a semiconductor film above a buried insulating layer on a substrate, a first pattern of gate regions and dummy gate regions;
    after forming the dummy gate regions, forming at least one insulating material that extends between two of the dummy gate regions and in contact with the buried insulating layer to define first and second domains of the semiconductor film that are electrically insulated from one another by the at least one insulating material; and forming at least one MOS transistor in each of the first and second domains using the gate regions.

18. The method of claim 17, wherein forming the MOS transistors further comprises forming source and drain regions of the MOS transistors by:

forming at least one insulating layer on the first pattern of gate regions and the dummy gate regions;

removing the at least one insulating layer between the gate regions and dummy gate regions except in the first portion between the two dummy gates; and epitaxially forming a first semiconductor material on the semiconductor film between the gate regions and the dummy gate regions except in the first portion between the two dummy gates.

19. The method of claim 18, wherein forming the source and drain regions of the MOS transistors further comprises partially etching the epitaxial material between the gate regions and the dummy gate regions.

20. The method of claim 17, wherein the at least one MOS transistor in each of the first and second domains are of a same conductivity type and the first and second domains are in a first zone of the semiconductor film, the method further comprising forming MOS transistors of a different conductivity type in second zone of the semiconductor film electrically insulated from the first zone.

21. The method of claim 20, wherein forming the MOS transistors of the different conductivity types comprises:

forming above the second zone of the semiconductor film a second pattern of gate regions and dummy gate regions; and forming source and drain regions of the transistors of the different conductivity type by epitaxially forming a second semiconductor material on the second zone of the semiconductor film between the gate regions and the dummy gate regions thereof.

* * * * *